United States Patent
Okayasu et al.

(10) Patent No.: US 6,586,924 B1
(45) Date of Patent: Jul. 1, 2003

(54) METHOD FOR CORRECTING TIMING FOR IC TESTER AND IC TESTER HAVING CORRECTING FUNCTION USING THE CORRECTING METHOD

(75) Inventors: Toshiyuki Okayasu, Tokyo (JP); Nobusuke Seki, Tokyo (JP)

(73) Assignee: Advantest Corporation, Tokyo (JP)

( * ) Notice: Subject to any disclaimer, the term of this patent is extended or adjusted under 35 U.S.C. 154(b) by 111 days.

(21) Appl. No.: 09/806,072

(22) PCT Filed: Aug. 16, 2000

(86) PCT No.: PCT/JP00/05473

§ 371 (c)(1),
(2), (4) Date: Mar. 23, 2001

(87) PCT Pub. No.: WO01/13136

PCT Pub. Date: Feb. 22, 2001

(30) Foreign Application Priority Data

Aug. 16, 1999 (JP) .......................... 11-229715

(51) Int. Cl.⁷ .................. G01R 1/04; G01R 31/08; G01R 35/00
(52) U.S. Cl. .............. 324/158.1; 324/532; 702/89
(58) Field of Search ..................... 324/158.1, 532, 324/765, 753; 702/89, 118, 119; 714/731, 736, 744; 368/120; 327/530, 535, 540

(56) References Cited

U.S. PATENT DOCUMENTS

| | | | | |
|---|---|---|---|---|
| 4,497,056 A | | 1/1985 | Sugamori | |
| 4,928,278 A | * | 5/1990 | Otsuji et al. | 702/89 |
| 5,095,262 A | * | 3/1992 | Henley et al. | 324/753 |
| 5,477,139 A | * | 12/1995 | West et al. | 324/158.1 |
| 5,491,673 A | * | 2/1996 | Okayasu | 368/120 |
| 5,712,582 A | * | 1/1998 | Yokota et al. | 327/156 |
| 5,731,735 A | * | 3/1998 | Yokota et al. | 327/535 |
| 6,060,898 A | * | 5/2000 | Arkin | 324/765 |
| 6,157,200 A | * | 12/2000 | Okayasu | 324/765 |
| 6,331,783 B1 | * | 12/2001 | Hauptman | 324/158.1 |

FOREIGN PATENT DOCUMENTS

| | | |
|---|---|---|
| EP | 0566823 | 10/1993 |
| JP | 495784 | 3/1992 |

* cited by examiner

*Primary Examiner*—Kamand Cuneo
*Assistant Examiner*—Jermele Hollington
(74) *Attorney, Agent, or Firm*—David N. Lathrop, Esq.; Gallagher & Lathrop

(57) ABSTRACT

A timing correcting method for correcting the timings of an IC tester at low cost, wherein the method uses a probe (300) for taking out a signal fed to a pin out of the pins of an IC socket (203) to which an IC to be measured is plugged when the probe is brought into contact with the pin and supplying a correcting pulse to the pin, and the timing of the correcting pulse taken in by a reference comparator (CP-RF) provided in the probe and the timing of a reference correcting pulse applied to an IC socket from a reference driver (DR-RF) provided in the probe are measured by a timing measuring function that the IC tester has, thus performing timing correction.

18 Claims, 13 Drawing Sheets

PRIOR ART  FIG.12
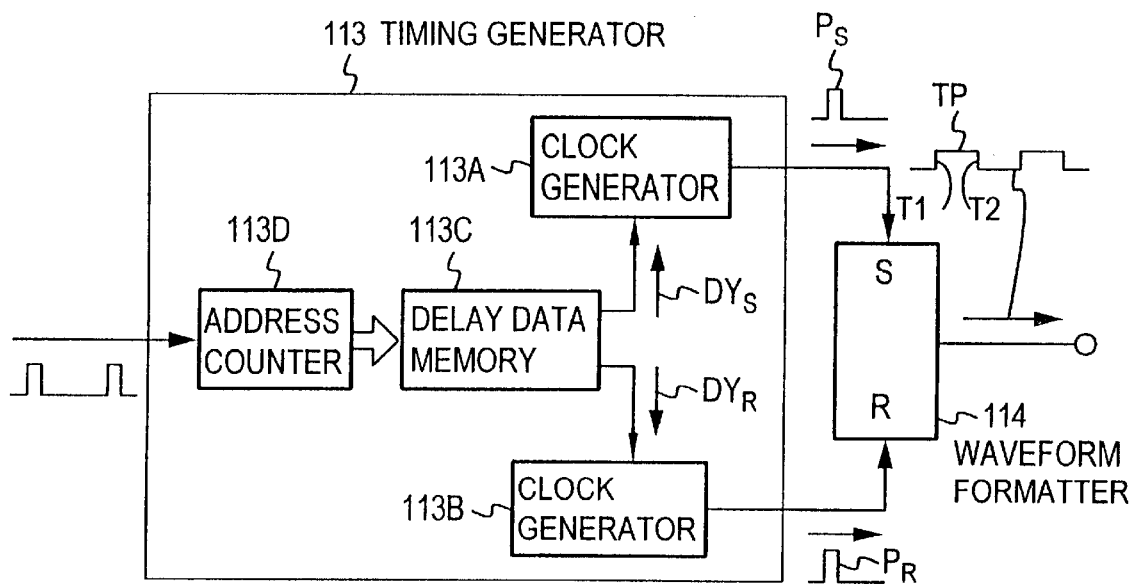
FIG.13  PRIOR ART
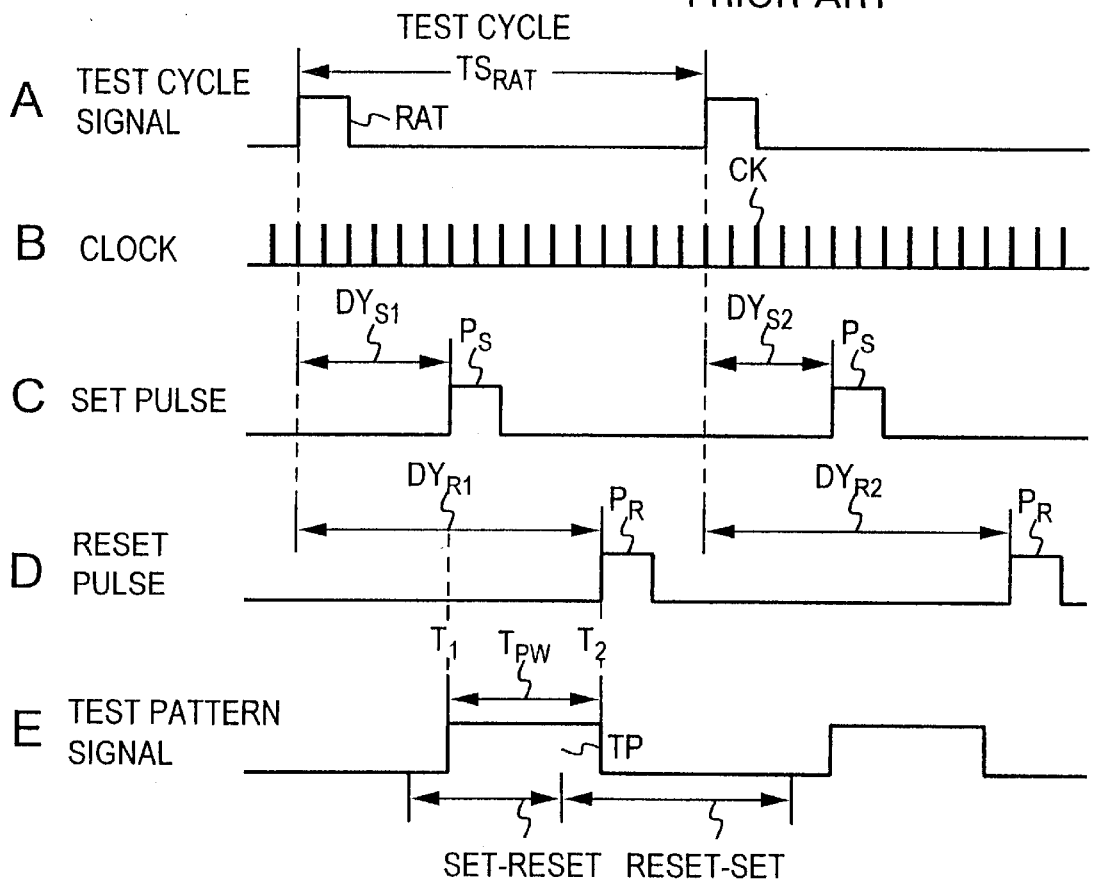

METHOD FOR CORRECTING TIMING FOR IC TESTER AND IC TESTER HAVING CORRECTING FUNCTION USING THE CORRECTING METHOD

TECHNICAL FIELD

The present invention relates to a timing calibration method for an IC tester for testing ICs such as memories and an IC tester equipped with a calibration function using the calibration method.

PRIOR ART

FIG. 11 depicts the general outlines of a commonly known IC tester. Reference character TES designates generally the IC tester. The IC tester TES comprises a main controller 111, a pattern generator 112, a timing generator 113, a waveform formatter 114, a logic comparator 115, a driver group 116, a comparator group 117, a failure analysis memory 118, a logical amplitude reference voltage source 121, a comparison reference voltage source 122 and a device power supply 123.

The main controller 111 is formed, in general, by a computer system and operates under the control of a test program prepared by a user, controlling the pattern generator 112 and the timing generator 113. The pattern generator 112 generates test pattern data, which is converted by the waveform formatter 114 to a test pattern signal that has an actual waveform, and the test pattern signal is provided to and stored in an IC under test 119 after being voltage-amplified by the driver group 116 to a waveform having an amplitude value set in the logical amplitude reference voltage source 121.

For example, when the IC under test 119 is an IC memory, a response signal read out of the IC under test 119 is compared by the comparator group 117 with a reference voltage from the comparison reference voltage source 122 to decide the logic level (voltage of a logic "H", voltage of a logic "L") of the response signal. The logic level thus decided is compared by the logic comparator 115 with an expected value that is output from the pattern generator 112; if a mismatch is found between the logic level and the expected value, it is decided that the memory cell of the address from which the response signal was read out is failing, and upon each occurrence of such a failure, the faulty address is stored in the failure analysis memory 118 for use in deciding, after completion of the test, whether the failed cell is repairable.

The timing generator 113 generates timing that defines the rise and fall timing of the waveform of the test pattern signal that is applied to the IC under test 119, and the timing of a strobe pulse that defines the timing for logical comparison by the logic comparator 115.

The respective timing is described in the user's prepared program so that at the user's intended timing the IC under test 119 can be actuated and tested for normal operation.

A description will be given, with reference to FIG. 12, the general outlines of the timing generator 113 and the waveform formatter 114. FIG. 12 depicts the general configurations of the waveform formatter and the timing generator for generating a one-channel test pattern signal. The waveform formatter 114 can be formed by an S-R flip-flop, which is supplied at its set and reset terminals S and R with set and reset pulses $P_S$ and $P_R$, respectively, to generate a test pattern signal TS that rises at predetermined timing T1 and falls at predetermined timing T2. In FIG. 12 the outputs from clock generators 113A and 113B are shown to be provided directly to the S-R flip-flop for the sake of brevity, but in practice, the connection of the outputs from a plurality of clock generators to the S-R flip-flop is controlled in real time in accordance with the waveform mode and pattern data.

The set and reset pulses $P_S$ and $P_R$ are generated by the pair of clock generators 113A and 113B. The generation timing of the set and reset pulses $P_S$ and $P_R$ by the clock generators 113A and 113B is defined by pieces of delay data $DY_S$ and $DY_R$ available from a delay data memory 113C.

The delay data memory 113C is accessed with an address signal that is provided from an address counter 113D. The address counter 113D generates an address signal whose address is incremented by one for each test cycle $TS_{RAT}$ after the start of testing; based on the address signal, an address assignment is made for each test cycle $TS_{RAT}$ during the test period, then delay data preset for each test cycle $TS_{RAT}$ is read out, and the read-out delay data is set in the clock generators 113A and 113B, which generate the set pulse $P_S$ and the reset pulse $P_R$ in accordance with the delay data.

FIGS. 13A–13E show how the above operations are carried out. The set pulse $P_S$ is generated at timing delayed, by given delay data $DY_{S1}$, behind, for instance, the rise timing of a rate clock RAT that defines the test cycle $TS_{RAT}$, and generates the reset pulse $P_R$ at timing delayed behind the rise timing of the rate clock RAT by delay data $DY_{R1}$, thereby generating the test pattern signal TP of a pulse width corresponding to the time difference $T_{PW}$ between the set and reset pulses $P_S$ and $P_R$ (see FIG. 13E). The resolution for setting the set and reset pulses $P_S$ and $P_R$ is defined by the pulse interval of a clock CK depicted in FIG. 13B.

From the above it will be understood that the test pattern signal TP can be set to rise and fall at arbitrary timing within the test cycle $TS_{RAT}$.

Next, the operation of the comparator group 117 will be described. The comparator group 117 performs:

(a) an operation of deciding the logic of the response signal from the IC under test 119 by comparing it with a predetermined reference level at predetermined timing and capturing the decided logical value; and (b) an operation of measuring the timing of the rise or fall of the response output signal TX.

FIGS. 14A–14F are explanatory of the operation (a). In the case of the operation (a), the comparator sets the timing of a strobe pulse STB at the timing when the response output signal TX ought to arrive, and captures the logical value of the response output signal TX at the set timing of the strobe pulse STB. In the FIG. 14 example, since the strobe pulse STB is set in the H-logic period of the response output signal TX, the comparator captures the H logic that is the result of the logic decision as shown in FIG 14D. Accordingly, when the expected value in this test cycle is H as depicted in FIG. 14, the result of the logical comparison by the logic comparator 115 is decided to be OK (good) as shown in FIG 14F.

FIGS. 15A–15E are explanatory of the operation (b). In the case of measuring the timing of the rise and fall of the response output signal TX, the phase of the strobe pulse STB that is applied to the comparator 17 is shifted for each test cycle $TS_{RAT}$ within the range of the test cycle $TS_{RAT}$ or within the range several times longer than the test cycle, the logical value of the comparator output varies at the timing of the strobe pulse, and the rise timing and fall timing of the response output signal are decided based on the timing of the strobe pulse at the time the state of the logical decision output reverses as depicted in FIG. 14D.

From the description given above with reference to FIGS. 11 to 15, it will be understood that the conventional IC tester has the capabilities of arbitrarily setting the generation timing of the test pattern signal and measuring the timing of the rise and fall of the response output signal TX from the IC under test.

The IC tester performs a timing calibration for in-phase application of test pattern signals to respective pins of the IC under test and a timing calibration for in-phase reading of response output signals from the IC under test into the IC tester.

A conventional method of timing calibration adopts a scheme that adjusts the delay times of variable delay circuits inserted in signal paths of respective pins to provide the same delay time on the signal paths.

The following two schemes are used to measure the delay time of the signal path.

(1) The time of reflection of the signal propagating along the signal path is measured through utilization of the timing measuring capability of the IC tester and the propagation delay time of the signal path is computed from the measured time of reflection.

(2) A probe is held in touch with each pin of an IC socket on which the IC under test is mounted, then a calibration pulse applied to each pin of the IC socket is applied via the probe to an oscilloscope to measure the phase difference between the calibration pulse and a signal of a reference phase, and the propagation delay time of each signal path is calculated from the phase difference.

With the scheme (1), the reflected wave of the calibration pulse is poor in waveform quality. This inevitably decreases the accuracy in detecting the arrival of the reflected wave, resulting in the accuracy of timing calibration being low.

With the scheme (2), since the oscilloscope is used to measure the phase difference between the signal under measurement and the reference signal, the measurement accuracy is high. Hence, the timing calibration can be performed with high accuracy.

With the measuring scheme (2), however, the signal path that permits calibration is limited specifically to a signal path equipped with a driver capable of sending a signal to the IC socket, and the signal path with only the comparator is not subject to measurement by this method. Hence, the signal path with only the comparator requires measuring its propagation delay time through utilization of the reflected wave as mentioned above in (1). Accordingly, the measuring scheme (2) is high in the accuracy of the timing calibration for the driver-associated path but low in the calibration accuracy for the comparator-associated path, and hence it has the defect of decreased accuracy in timing calibration as a whole.

Furthermore, the scheme (2) involves the preparation of an oscilloscope that is not ever necessary for IC testing. A two-input oscilloscope is expensive which has a configuration that outputs data corresponding to the phase difference between two signals and sends the data to the IC tester to adjust the delay time of a variable delay circuit. Thus, this method requires the preparation of such a costly oscilloscope only for timing calibration, and hence it is economically disadvantageous.

An object of the present invention is to provide a timing calibration method for an IC tester that reduces the cost for timing calibration and permits accurate timing calibration irrespective of the driver- or comparator-associated path, and an IC tester that possesses the function of implementing the timing calibration method.

DISCLOSURE OF THE INVENTION

The present invention implements a timing calibration through utilization of the afore-mentioned timing generation and timing measurement features which common IC testers have inherently.

According to a first aspect of the present invention, there is provided a timing calibration method for an IC tester which uses a probe with a reference comparator, said method comprising the steps of:

(a) selectively contacting respective pins of an IC socket one after another by said probe from outside;

(b) applying a calibration pulse from a driver of said IC tester to each pin of said IC socket;

(c) capturing said calibration pulse applied from said driver to said each pin by said reference comparator of said probe at the timing of a reference strobe pulse that is provided to said reference comparator;

(d) calculating a deviation between the timing of said calibration pulse and the timing of said reference strobe pulse; and (e) adjusting the delay time of a variable delay circuit provided in each signal path of said driver so that said deviation takes a predetermined value.

According to a second aspect of the present invention, there is provided a timing calibration method which uses a probe with a reference driver, said method comprises the steps of:

(a) selectively contacting respective pins of an IC socket one after another by said probe from outside;

(b) applying a reference calibration pulse from said reference driver to each pin of said IC socket;

(c) capturing said reference calibration pulse applied from said reference driver to each pin by each comparator of said IC tester at the timing of a strobe pulse that is provided to said each comparator;

(d) calculating a deviation between the timing of said reference calibration pulse and the timing of said strobe pulse; and (e) adjusting the delay time of a timing calibrating variable delay circuit inserted in a signal path of said strobe pulse so that said deviation takes a predetermined value.

According to a third aspect of the present invention, there is provided IC tester equipped with a calibration function which has drivers each provided in correspondence with one of pins of an IC socket on which ICs under test are placed, for applying a test pattern signal to the input terminal of each IC under test, and a comparator for capturing the logical value of a response output signal provided at the output terminal of each IC under test, and decides whether the response signal captured by said comparator coincides with a predetermined expected value to test said IC under test for normal operation, said IC tester comprising:

a probe for selectively contacting the pins of said IC socket one after another;

a reference comparator mounted in said probe, for capturing a signal applied to the pin of said IC socket contacted by said probe at the timing of a reference strobe pulse;

a driver variable delay circuit provided in the signal path of each of said drivers, for adjusting the delay time of the signal to be provided to the pin of said IC socket;

a strobe variable delay circuit provided in the signal path of the strobe pulse to be provided to said each driver, for adjusting the delay time of said strobe pulse; and calibration control means for comparing the logical value of the signal captured by said reference comparator with an expected value and for controlling said driver variable delay circuit so that the phase of a calibration pulse applied to the pin of said IC socket from said each driver coincides with reference timing of said reference strobe pulse.

According to the present invention, since it is decided whether the timing of the calibration pulse captured from the IC socket into the probe coincides with reference timing through utilization of a timing measuring function that the IC tester inherently possesses, any particular expensive jig, such as an oscilloscope, need not be provided outside the tester. Hence, the timing calibration can be performed at low cost.

Further, according to the present invention, the reference driver is mounted in the probe and the calibration pulse of a reference phase is applied from the reference driver to the pin of the IC socket with which the probe is in contact. The calibration pulse is captured by the comparator of the IC tester via a cable or the like from the pin of the IC socket.

The comparator of the IC tester measures the timing of the calibration pulse while sequentially shifting the phase of the strobe pulse. Based on the timing measured result, the delay time of a variable delay circuit inserted in the signal path of the strobe pulse is set so that the timing of, for example, the leading edge of the calibration pulse coincides with reference timing, with which the timing calibration of the comparator is completed.

As described above, the present invention utilizes the timing measuring capability of the IC tester to perform timing calibration, and hence does not require any particular jig. This provides an advantage that the cost for timing calibration is very low.

Moreover, the present invention utilizes a direct wave as a signal for measuring the propagation delay time of the signal path, and hence the invention provides highly accurate measurement results. This also leads to highly accurate timing calibration.

Besides, according to the present invention, the probe is mounted on an automatic positioning device (robot), by which the probe is automatically brought into contact with each pin of the IC socket. This produces the advantage of automated timing calibration as well.

Furthermore, since the present invention offer a timing calibration device that has a plurality of probes and simultaneously performs timing calibration of driver- and comparator-associated signal paths connected to a plurality of IC sockets, it is also possible to sharply reduce the time for calibration.

BRIEF DESCRIPTION OF THE DRAWINGS

FIG. 12 is a block diagram for explaining the general outlines of a timing generator used in the IC tester depicted in FIG. 11.

FIGS. 13A–13E are waveform diagrams for explaining the operation of the timing generator shown in FIG. 12.

BEST MODE FOR CARRYING OUT THE INVENTION

Figure 1:
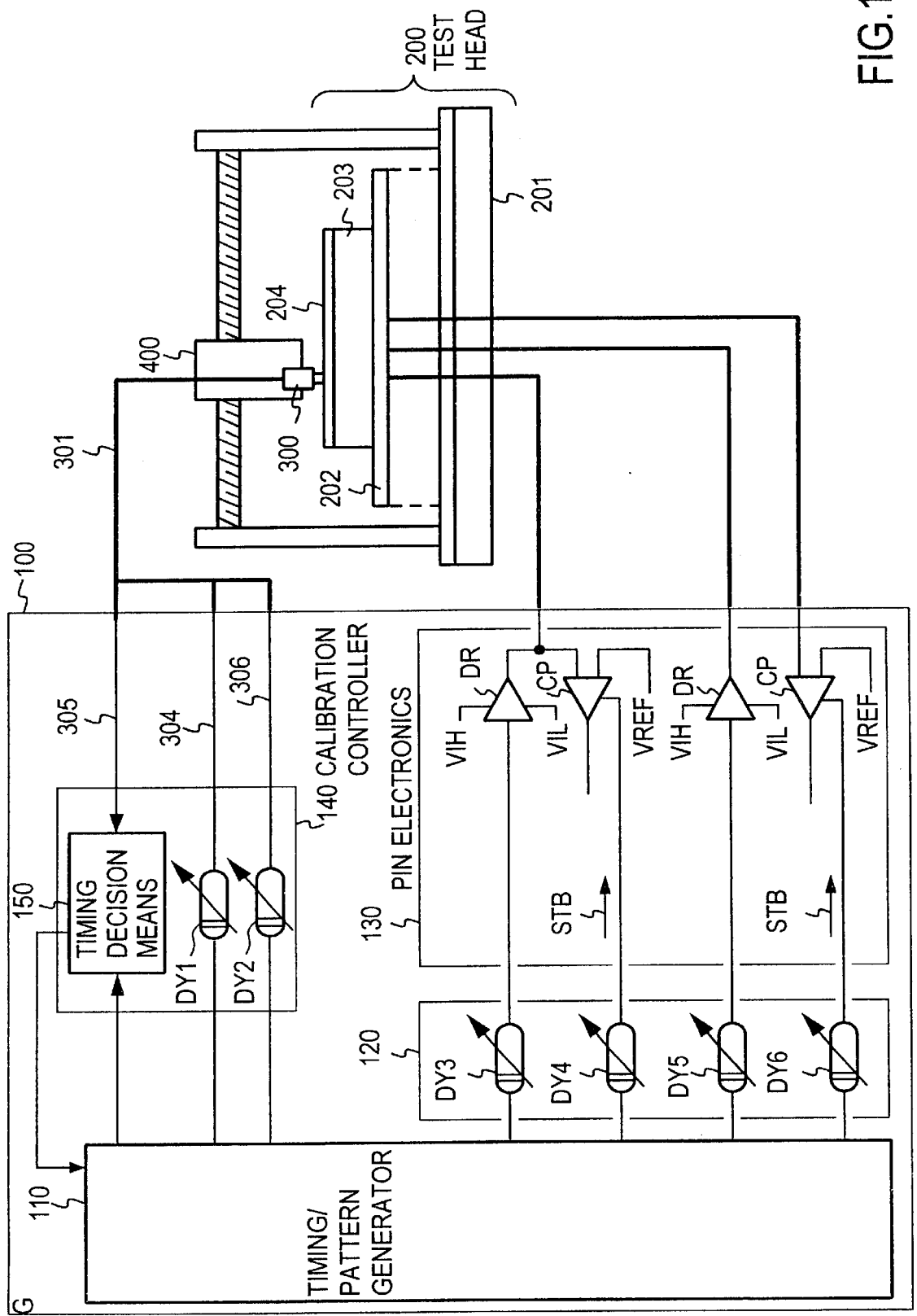
FIG. 1 is a block diagram for explaining an embodiment of the IC tester according to the present invention.

In FIG. 1 there is illustrated an embodiment of the IC tester equipped with the timing calibration feature according to the present invention. Embodiments of this IC tester will hereinafter be described together with the timing calibration method according to the present invention.

In FIG. 1, reference numeral 100 denotes an IC tester, 200 a test head, 300 a probe proposed by the present invention, and 400 an automatic positioning device that supports the probe 300 and performs positioning.

The IC tester comprises a timing/pattern generator 110, a timing calibration delay time setting part 120, pin electronics 130 and a calibration controller 140. The calibration controller 140 comprises a timing decision means 150 and variable delay circuits DY1 and DY2. The timing decision device is shown which is specifically provided in the present invention.

The test head 200 comprises a mother board 201, a socket board 202 disposed above the mother board 201, and an IC socket 203 mounted on the socket board 202. The pin electronics 130 may also be installed on the mother board 201. In this embodiment, during calibration a contact board 204 is placed on the surface of the IC socket 203 in place of an IC under test (not shown, in particular), and each pin of the IC socket 203 is electrically connected to the corresponding one of contact pads (not shown) formed on the surface of the contact board 204, establishing electrical contact between each pin of the IC socket 203 and the probe 300 via the contact board 204. Accordingly, FIG. 1 depicts the IC tester in the state of calibration.

Conventionally, the probe 300 is formed only by a mere contactor, and a cable 301 connected to the probe 300 is connected to an oscilloscope (not shown); a calibration pulse from each driver DR in the pin electronics 130 is detected by the probe 300 and input via the cable 301 to the oscilloscope for measuring the phase of the calibration pulse.

As will be described later on with reference to FIG. 2, the present invention features such a configuration as described later on with reference to FIG. 2 in which: no oscilloscope is used; a reference driver and a reference comparator are provided in the probe 300; the phases of the calibration pulses from the respective drivers DR of the pin electronics 130 are detected by the reference comparator; it is checked by the timing decision device 140 as to whether the calibration pulses lead or lag relative to each other; and, based on the check result, the amounts of delay of the variable delay circuits DY are controlled so that the calibration pulses are timed to each other.

Further, a reference calibration pulse of reference timing is provided from the timing/pattern generator 110 to the probe 300, then the reference calibration pulse is input via the reference driver of the probe 300 to each comparator CP in the pin electronics 130, and the application of the strobe pulse to the comparator CP is timed to the leading edge (generally, a 50% position on the leading edge) of the reference calibration pulse, with which the timing calibration of the comparator CP is completed.

In FIG. 1 only one IC socket 203 is shown, but in practice, for example, 12, 24, or 48 IC sockets are placed on the socket board 202, and ICs to be tested are placed on the respective IC sockets 203 at one time and tested at the same time.

Figure 2:
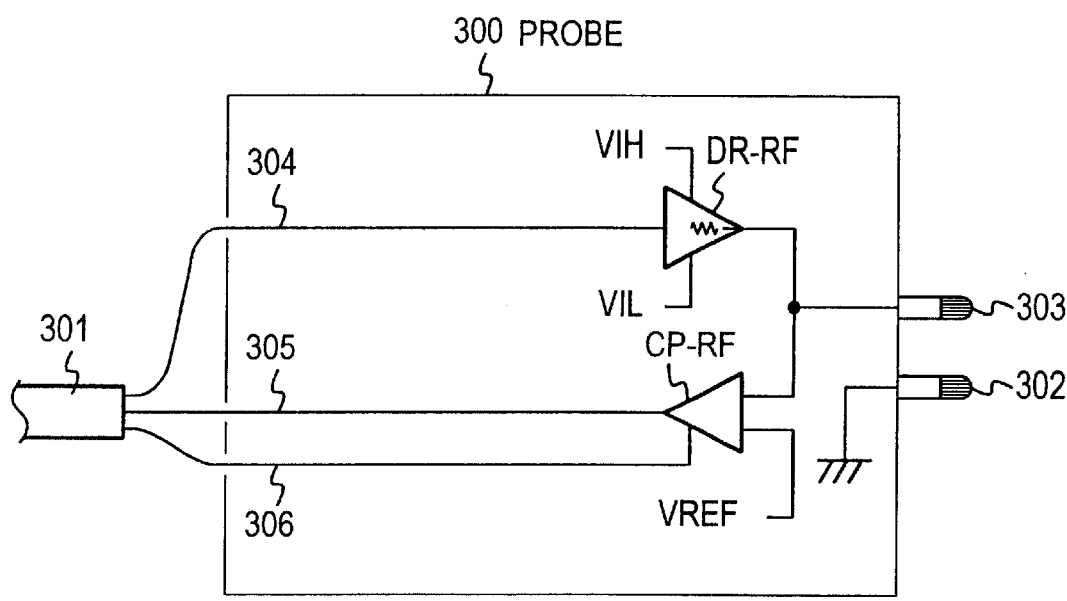
FIG. 2 is a block diagram for explaining an example of the internal configuration of a probe shown in FIG. 1.

FIG. 2 depicts an example of the internal configuration of the probe 300 proposed in the present invention. The probe 300 is mounted on the automatic positioning device 400, by which the probe 300 is moved in the X-Y direction along the top surface of the socket board 202 and, at the position of a desired pin (at the position of an electrical pad formed on the surface of the contact board 204), the probe 300 is moved in the Z direction (vertically to the top surface of the contact board 204 to bring spring contacts 302 and 303 resiliently projecting out of the probe 300 into engagement with the desired electrical pad. In the illustrated example the spring contact 302 is for contact with the ground potential and the contact 303 is for contact with a signal line.

The contact 303 for contact with the signal line is connected to the output terminal of a reference driver DR-RF and the input terminal of a reference comparator CP-RF both provided in the probe 300. Connected to the input terminal of the reference driver DR-RF is a reference calibration pulse supply line 304. Connected to the output terminal of the reference comparator CP-RF is a reference comparator output line 305. Further, a reference strobe pulse supply line 306 is connected to a strobe pulse supply terminal of the reference comparator CP-RF.

The reference calibration pulse supply line 304, the reference comparator output line 305 and the reference strobe pulse supply line 306 are bundled in the cable 301 and connected to the IC tester 100, wherein the reference calibration pulse supply line 304 and the reference strobe pulse supply line 306 are connected to the timing/pattern generator 110 via the timing calibrating variable delay circuits DY1 and DY2 of the calibration controller 140 as shown in FIG. 1.

The reference comparator output line 305 is connected to the one input terminal of the timing decision device 150 to input thereto the logical value detected by the reference comparator CP-RF. An expected value is provided to the other input terminal of the timing decision device 150 from the timing/pattern generator 110, and a logical comparison is made between the expected value and the reference comparator output to decide whether the timing of the output from the pin electronics 130 coincides with the reference timing.

More specifically, for example, in the case where an "H" logic value is given as the expected value and the result of the logical decision for the reference comparator CP-RF of the probe 300 does not coincide with the expected value "H" at the timing of the reference strobe pulse, the timing decision means 150 increases the delay of the variable delay circuit DY2 by a fixed value and repeats the comparison between the logical decision result and the expected value "H" at the reference strobe pulse. The first coincidence of the decision result the expected value "H" means the detection of the timing of the reference calibration pulse, and the delay of the variable delay circuit DY2 is fixed which provided the timing of the reference strobe pulse at that time. For example, as will be described later on with reference to FIG. 8, in the case of controlling the delay of the variable delay circuit D2 in digital value, the digital value of its phase (delay) is written in a delay circuit DY2 setting memory (not shown) and the delay circuit DY2 is set at the value written in the memory.

A description will be given below of a timing calibration method for the path of the driver DR and a timing calibration method for the path of the comparator CP in the pin electronics 130. Prior to the calibrating operation described below, it is necessary to calibrate the output timing of the reference driver DR-RF and the input timing of the reference comparator CP-RF that are mounted in the probe 300. This requirement can be met simply by calibrating the one timing with respect to the other chosen as reference calibration timing.

For example, in the case of choosing the reference driver DR-RF, a calibration pulse is output from the reference driver DR-RF and, in the example of FIG. 2, the calibration pulse is applied directly to the reference comparator CP-RF, wherein the variable delay circuit DY2 (see FIG. 1), which determines the delay time of the strobe pulse, is controlled so that the application of the strobe pulse is timed to the leading edge (a 50% position on the leading edge).

On the other hand, in the case of choosing the reference comparator CP-RF, a calibration pulse is provided therefrom and the variable delay circuit DY1 (see FIG. 1), which determines the delay time of the calibration pulse, is controlled to time its leading edge (the 50% position on the leading edge) to the application of the strobe pulse.

In either case, the calibration establishes the desired timed relationship between the output from the reference driver and the input to the reference comparator, and this timing is used to calibrate the timing of the drivers DR and capacitors CP mounted in the pin electronics 130 described below.

Figure 3:
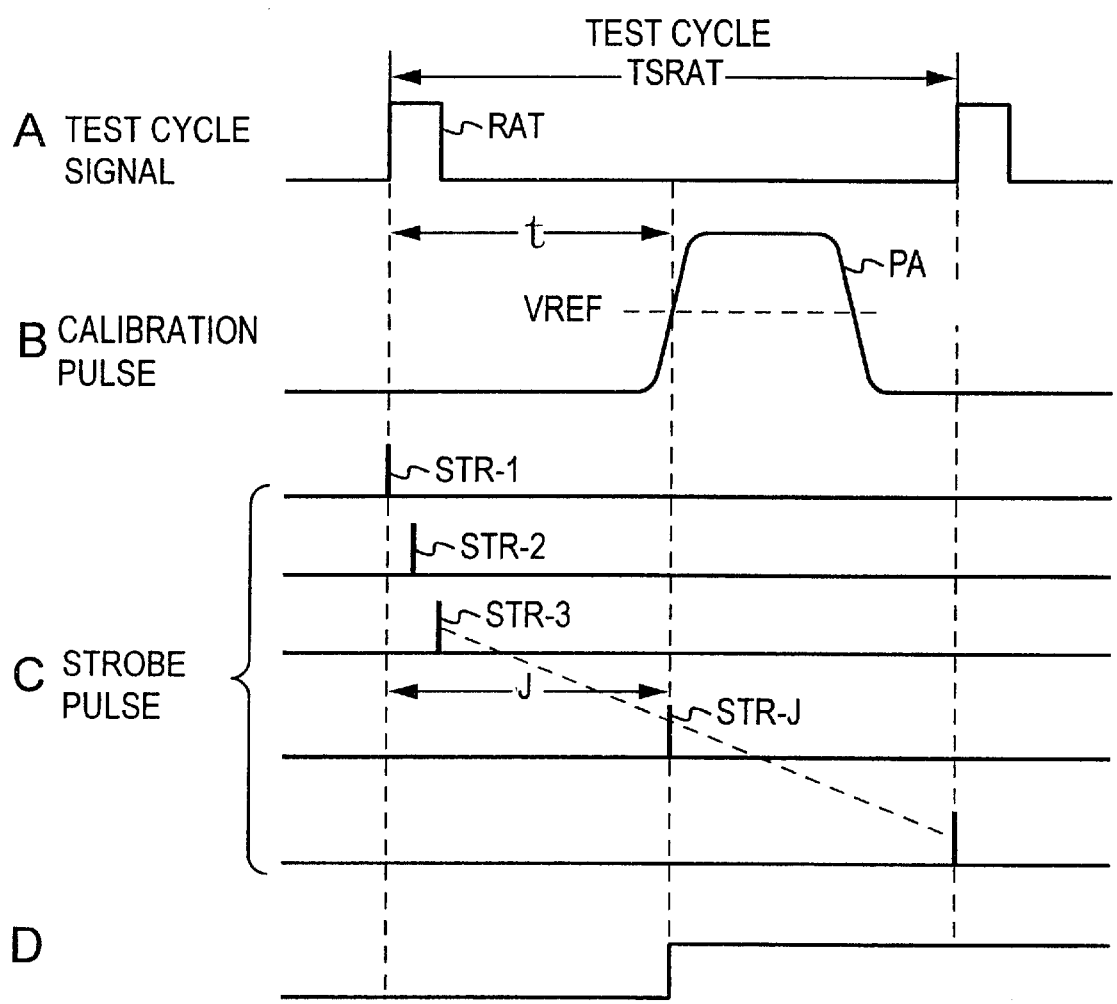
FIGS. 3A–3D are waveform diagrams for explaining the calibration method according to the present invention.

A description will be given first of how to calibrate the comparators CP mounted in the pin electronics 130. In this instance, the timing/pattern generator 110 repeatedly outputs a reference calibration pulse PA depicted in FIG. 3B onto the reference calibration pulse supply line 304 with the test cycle period $TS_{RAT}$ depicted in FIG. 3A. The reference calibration pulse PA (FIG. 3B) is provided via the cable 301 to the probe 300, thence to the test head 200 via the reference driver DR-RF mounted in the probe 300 and the spring contact 303, and thence to a selected one of the comparators CP of the pin electronics 130.

The comparator CP compares the calibration pulse with a reference voltage VREF while shifting the phase of the strobe pulse STB for each test cycle by incrementing (or decrementing) the delay time of a variable delay circuit DY4 or DY6 by a fixed value (FIG. 3C), thereby determining the phase (the amount of delay) of a strobe pulse STR-J in which the logical value of the comparison result reverses. As the result of this, the delay time J of the strobe pulse STB that is provided to the comparator CP (that is, the comparison timing of the comparator CP) is correctly calibrated so that the timing J of the calibration pulse PA measured by the comparator CP (i.e., the timing J at which the compared output from the comparator CP (FIG. 3D) reverses when the value of the reference voltage VREF is at a 50% position of the amplitude of the calibration pulse to which the value of the reference voltage VREF is set) coincides with the timing t of the reference calibration pulse PA (t=J). In this way the calibration of the comparator CP is performed. In this case, the decision as to whether the reference voltage is at the 50% position of the amplitude of the calibration pulse may be made depending on whether the probabilities of the comparator output going high and low are 50% as the result of repeated decision within a certain period.

Next, a description will be given of how to calibrate each driver mounted in the pin electronics 130. In this instance, the timing/pattern generator 110 repeatedly supplies calibration pulses of the same phase via variable delay circuits DY3 and DY5 to the drivers DR for each test cycle. Each driver DR sends the calibration pulse to the test head 200.

In the test head 200 the probe 300 captures the calibration pulse that is sent from the driver DR to be calibrated via an electrical pad formed on the contact board 204. The result of comparison between the calibration pulse captured by the probe 300 and the reference voltage is captured by the calibrated reference comparator CP-RF in the probe 300 at the timing of the reference strobe pulse set in the reference phase. By setting the delay time of the variable delay circuit DY3 or DY5 so that the logical decision result of the timing decision device 140 reverses when the timing of application of the reference strobe pulse is, for example, at a 50% position on the leading edge of the calibration pulse, the timing calibration of the path of the driver DR is completed. The decision as to whether the reference voltage is at the 50% position on the leading edge of the calibration pulse may be made depending on whether the probabilities of the comparator output going high and low are 50%.

Figure 4:
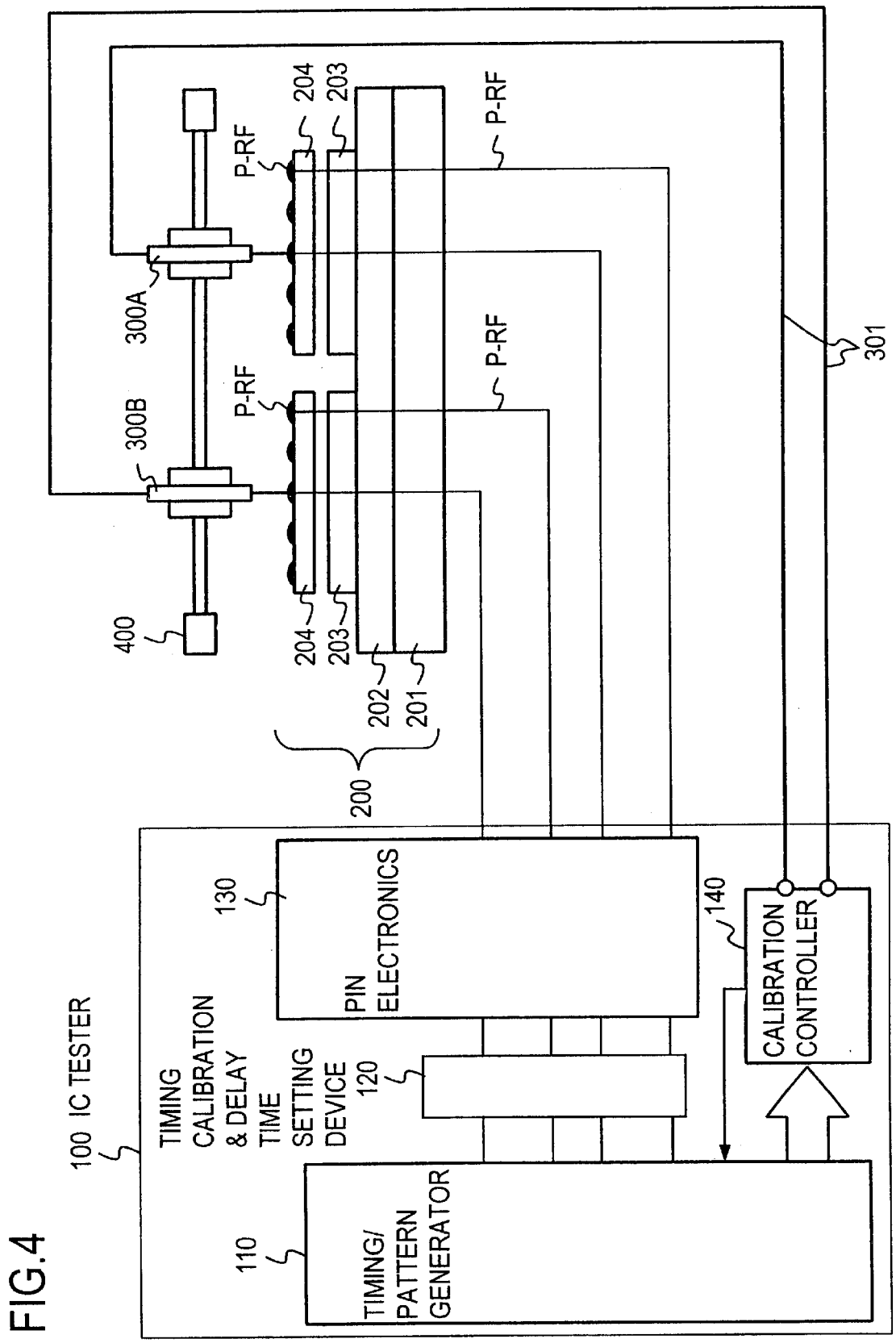
FIG. 4 is a block diagram for explaining another calibration method according to the present invention.

FIG. 4 illustrates another embodiment of the present invention, in which blocks 110, 120, 130 and 140 are identical in configuration with the corresponding blocks in FIG. 1. In the timing calibration method of the FIG. 4 embodiment: a reference pin P-RF to which reference timing is provided is determined for each IC socket (simply by choosing any one of the pins of the IC socket as the reference pin); the probe 300 is brought into contact with that one of the contact pads on the contact board 204 which corresponds to the reference pin P-RF (which contact pad is identified by the same reference character P-RF as that of the reference pin), then the calibration pulse is provided via the reference pin P-RF to the probe 300 from that one of the drivers DR of the pin electronics 130 which corresponds to the reference pin, then the timing of the calibration pulse is measured by the reference comparator CP-RF of the probe 300, and the timing thus measured is determined as reference timing (that is, the timing of the reference strobe pulse is determined by controlling the delay circuit DY2). Next, the delay time of the variable delay circuit corresponding to each driver is controlled so that the timing of the calibration pulse provided to the probe 300 from the driver coincides with the input timing of the reference comparator CP-RF for each pin. The timing of the reference calibration pulse that is applied to the reference driver DR-RF may be determined by adding the input timing of the reference comparator CP-RF with the premeasured phase difference between the reference comparator and the reference driver. The timing thus defined is determined as reference timing, and the reference calibration pulse is applied from the probe 300 to each of the other pins to calibrate the input timing of the corresponding comparator CP by the variable delay circuit DY4 or DY6.

In the case of adopting this calibration method, for example, when the driver-associated path of the pin determined as the reference pin P-RF is used as the reference, delay times of drivers of the other pins are calibrated to the initial delay time of the driver DR of the reference pin. Further, the input timing of the comparator of each pin is also calibrated to the delay time of the driver DR of the pin initially determined as the reference pin, with the result that the delay times of the both driver- and comparator-associated paths of the respective pins in the IC socket concerned are set to be the same.

Even if there is an error in the delay time of the driver-associated path of the reference pin in each IC socket, the error will not ever affect IC testing. That is, if there is no phase difference between the pins under test, such an error exerts no influence on the test. What is called for is to provide the same timing for test patterns from drivers at respective pin positions of the IC under test and the same timing for capturing the response signals by the comparators at the pin positions; the magnitude of the phases (delays) of the test patterns applied from the drivers and the comparator input timing does not matter. Accordingly, it is possible to determine the driver timing relative to arbitrary fixed timing and the comparator timing relative to arbitrary fixed timing without determining any particular reference pin.

For example, the timing of the reference calibration pulse and the timing of the reference strobe pulse are fixed at arbitrary values by the delay circuits DY1 and DY2, and the delay circuits DY3 and DY5 are adjusted so that the calibration pulse from each driver of the pin electronics 130 is timed to the reference comparator CP-RF. As regards the comparator, the delay times of the variable delay circuits DY4 and DY6 are adjusted so that the input timing of each comparator of the pin electronics 130 (the strobe pulse timing) is made to coincide with the timing of the reference calibration pulse applied to each pin from the reference driver DR-RF.

The FIG. 4 embodiment is shown to have a construction in which two probes 300A and 300B are mounted on the same automatic positioning device 400 and are simultaneously driven to perform the timing calibration of two IC socket at the same time. Reference numeral 150 denotes a calibration controller.

Figure 5:
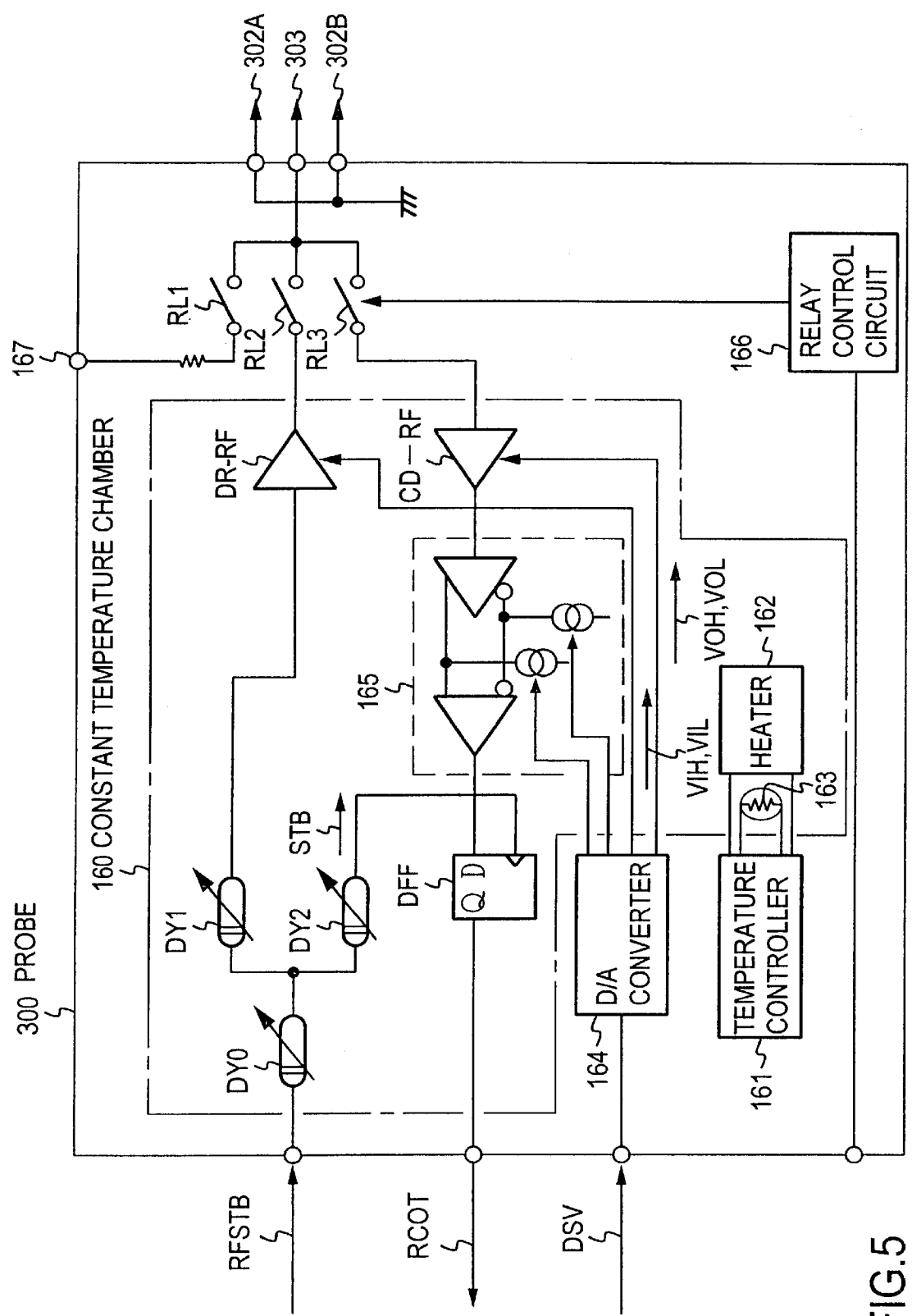
FIG. 5 is a block diagram illustrating another example of the internal configuration of the probe depicted in FIG. 2.

FIG. 5 illustrates another example of the probe 300 in each embodiment described above. The same line is shared for the reference strobe pulse supply line 306 and the reference calibration supply line 304 to the probe 300, and the relay switches RL2 and RL3 are selectively changed over for the strobe pulse application and for the calibration pulse application. Further, the variable delay circuits DY1 and DY2 in the calibration controller 140 in FIG. 1 are placed in the probe 300, and the temperature in the probe 300 is kept constant. That is, in this example the variable delay circuit DY1 for applying the reference calibration pulse to the reference driver DR-RF, the variable delay circuit DY2 for applying the reference strobe pulse to a D flip-flop that captures the comparison decision result of the reference comparator CP-RF, and a variable delay circuit DYO for delaying output signals from the both delay circuit by the same time interval are mounted in the probe 300; these variable delay circuits DYO, DY1 and DY2, the reference driver DR-RF and the reference comparator CP-RF and the D flip-flop are placed in a constant temperature chamber 160 and are held in a constant-temperature environment so as to suppress delay time variations by temperature changes. Reference numeral 161 denotes a temperature controller for controlling the temperature in the constant temperature chamber 160 to be constant; 162 denotes, for example, a heater for heating the inside of the constant temperature chamber; and 163 denotes a temperature sensor for detecting the temperature in the constant temperature chamber.

Reference numeral 164 denotes a D/A converter. The D/A converter 164 is supplied with a digital set value from the IC tester 100 and outputs voltages VIH and VIL for setting the amplitude value of the pulse that the reference driver DR-RF and a control signal that is provided to an adjustment circuit 165 for adjusting the delay time difference between the rise and fall of the detection pulse that the reference comparator CP-RF outputs. That is, the adjustment circuit 165 sets current values of positive and negative side constant current circuits to adjust idling currents of the circuit that turns ON upon rise of the detection pulse and the circuit that turns ON upon fall of the detection pulse, thereby adjusting the delay times of the leading and trailing edges of the detection pulse to be equal to each other.

Reference numeral 166 denotes a relay control circuit for controlling the relays RL1, RL2 and RL3. Reference numeral 167 a signal take-out terminal that is used in the case of monitoring the waveform of a signal that is applied to the spring contact 303. With an oscilloscope connected to this signal output terminal, it is possible to monitor the signal waveform.

In the FIG. 5 and preceding embodiments the output terminal of the reference driver DR-RF and the input terminal of the reference comparator CP-RF mounted in the probe 300 are directly connected inside the probe 300, but in this instance, since the signal input from the common spring contact 303 is branched at the branch point to supply to the driver and the comparator, reflections occurs at the branch point, likely degrading the signal waveform.

In the case of applying the calibration pulse from the reference driver DR-RF to the reference comparator CP-RF to calibrate their timing, the calibration is performed without including the time of signal propagation to the extremity of the spring contact 303, incurring the possibility that an error occurs accordingly.

Figure 6:
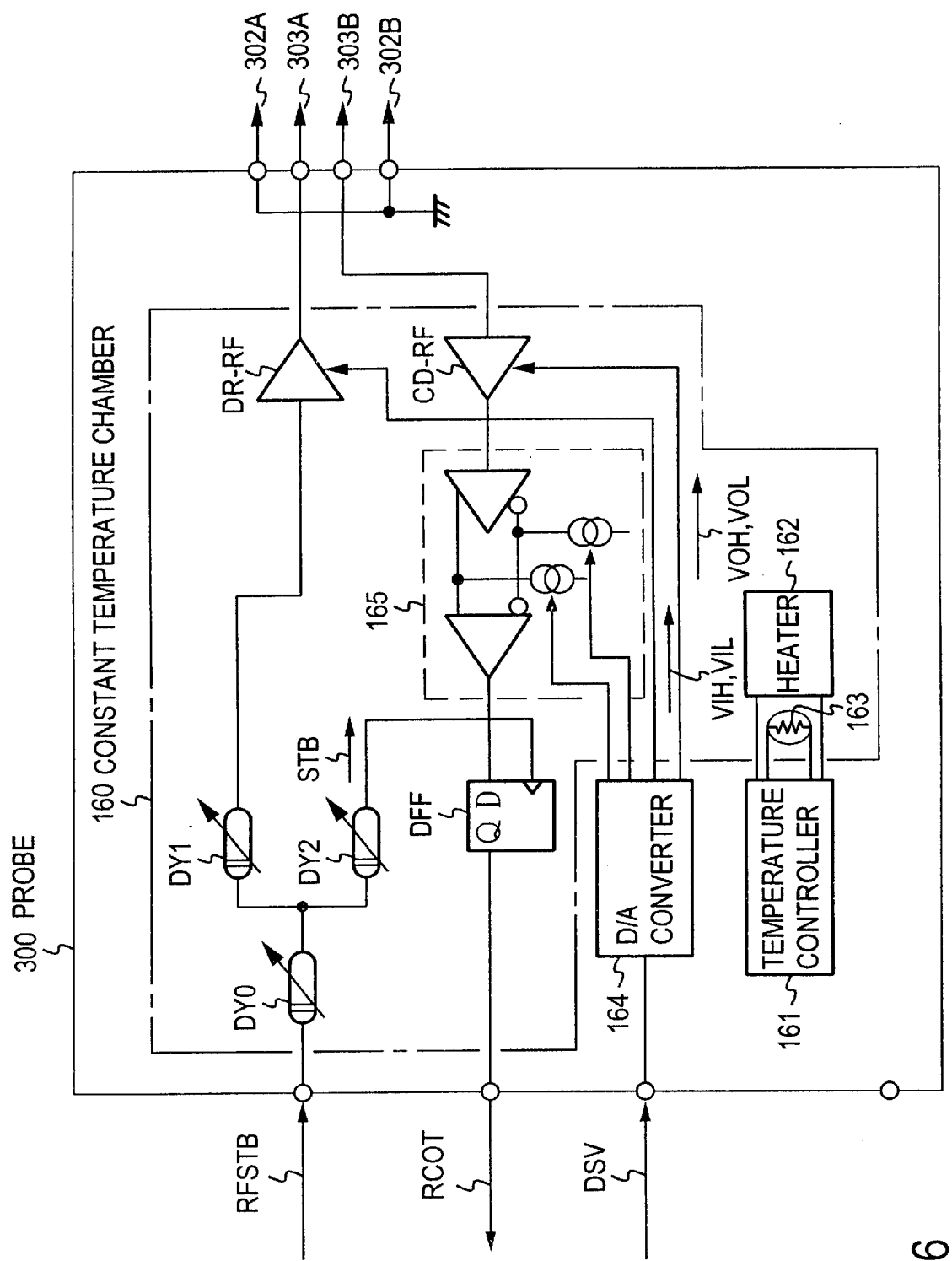
FIG. 6 is a block diagram for explaining a modified form of the embodiment depicted in FIG. 5.

For the reasons given above, in the FIG. 6 embodiment of FIG. 6, the output terminal of the reference driver DR-RF and the input terminal CP-RF are connected to separately provided spring contacts 303A and 303B, which are brought into contact with the contact board 204 to perform calibration.

Figure 7:
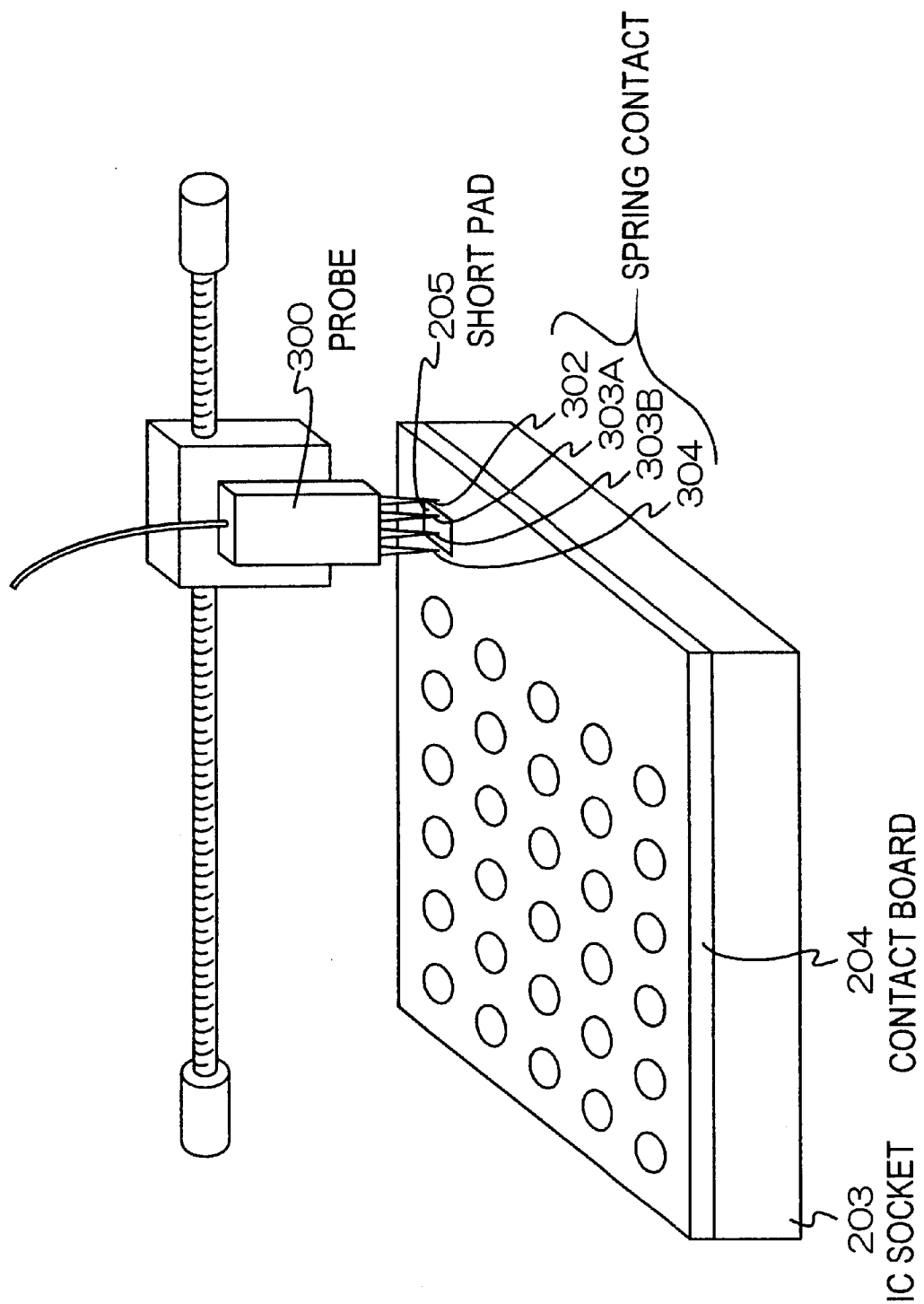
FIG. 7 is a perspective view for explaining a short pad for calibration use that is suitable for application to the embodiment depicted in FIG. 6.

Accordingly, in this case, for example, as depicted in FIG. 7, a short pad is placed at an arbitrary position on the contact board 204; the spring contacts 303A and 303B are contacted with the contact board 204 to short their tips, and in this state the reference driver DR-RF and the reference comparator CP-RF mounted on the probe 300 are calibrated.

Accordingly, since the FIG. 6 embodiment has no branch points at the output side of the reference driver DR-RF and the input side of the reference comparator CP-RF, no reflections occur and signal waveform will not deteriorate.

Moreover, since the calibration of the reference driver DR-RF and the reference comparator CP-RF is performed including the extremities of the spring contacts 303A and 303B, the condition for this calibration coincides with that for the calibration of the driver DR and the comparator CP on the pin electronics 130 that is carried out by contacting the tips of the spring contacts 303A and 303B with the contact board 204—this also serves to increase the calibration accuracy.

While in the embodiments of FIGS. 5 and 6 the temperature controller 161, the D/A converter 164 and the relay control circuit 166 are mounted in the probe 300, it will easily be seen that they need not always to be mounted in the probe 300 but may also be mounted in the calibration controller 150 depicted in FIG. 4.

Figure 8:
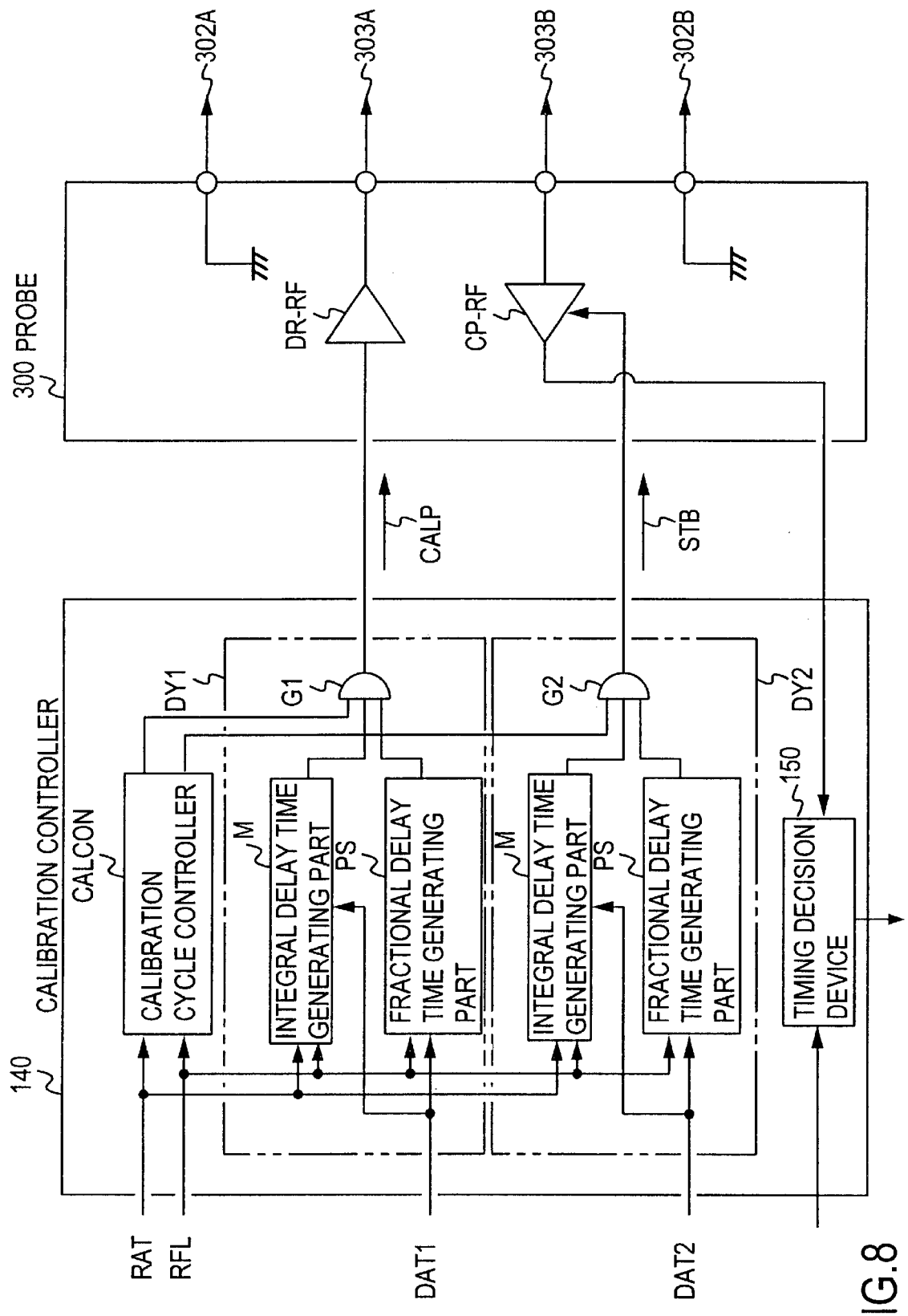
FIG. 8 is a block diagram for explaining an example of the internal configuration of a calibration controller shown in FIG. 4.

FIG. 8 illustrates a concrete example of the calibration controller 140 shown in FIG. 4. The calibration controller 140 of this example comprises a calibration cycle controller CALCON, variable delay circuits DY1 and DY2, and a timing decision device 150 that decides whether the timing of a signal for input to the reference comparator CP-RF coincides with the timing of the strobe pulse STB.

The calibration cycle controller CALCON generates a control signal for determining the test cycle in which to perform calibration. The variable delay circuits DY1 and DY2 are each composed of an integral delay time generating part M, a fractional delay time generating part PS and a gate G.

The integral delay time generating part M can be formed, for example, by a shift register and a selector for selectively taking out the outputs of respective stages of the shift register. The rate clock RAT, which defines the test cycle TS, is delayed by the shift register in synchronism with the period of a reference clock RFL, and the delayed rate clock RAT is taken out by the selector from that one of the stages that outputs the rate clock RAT after the time corresponding to an integral multiple of the reference clock RFL in set delay data DAT1 or DAT2, and this delayed rate clock RAT is provided as a gate signal to one input terminal of the gate G.

The fractional delay time generating part PS is formed by a circuit that phase-shifts the reference clock RFL at high resolution, and generates a pulse train with a delay time (phase shift amount) corresponding to a fractional value smaller than one period of the reference clock RFL in the delay data DAT1 and DAT2.

The gate G extracts, by the gate signal from the integral delay time generating part M, the corresponding pulse in the pulse train generated by the fractional delay time generating part PS, and outputs a calibration pulse CALP and a strobe pulse STB delayed by time intervals corresponding to the delay data DAT1 and DAT2, respectively.

Figure 9:
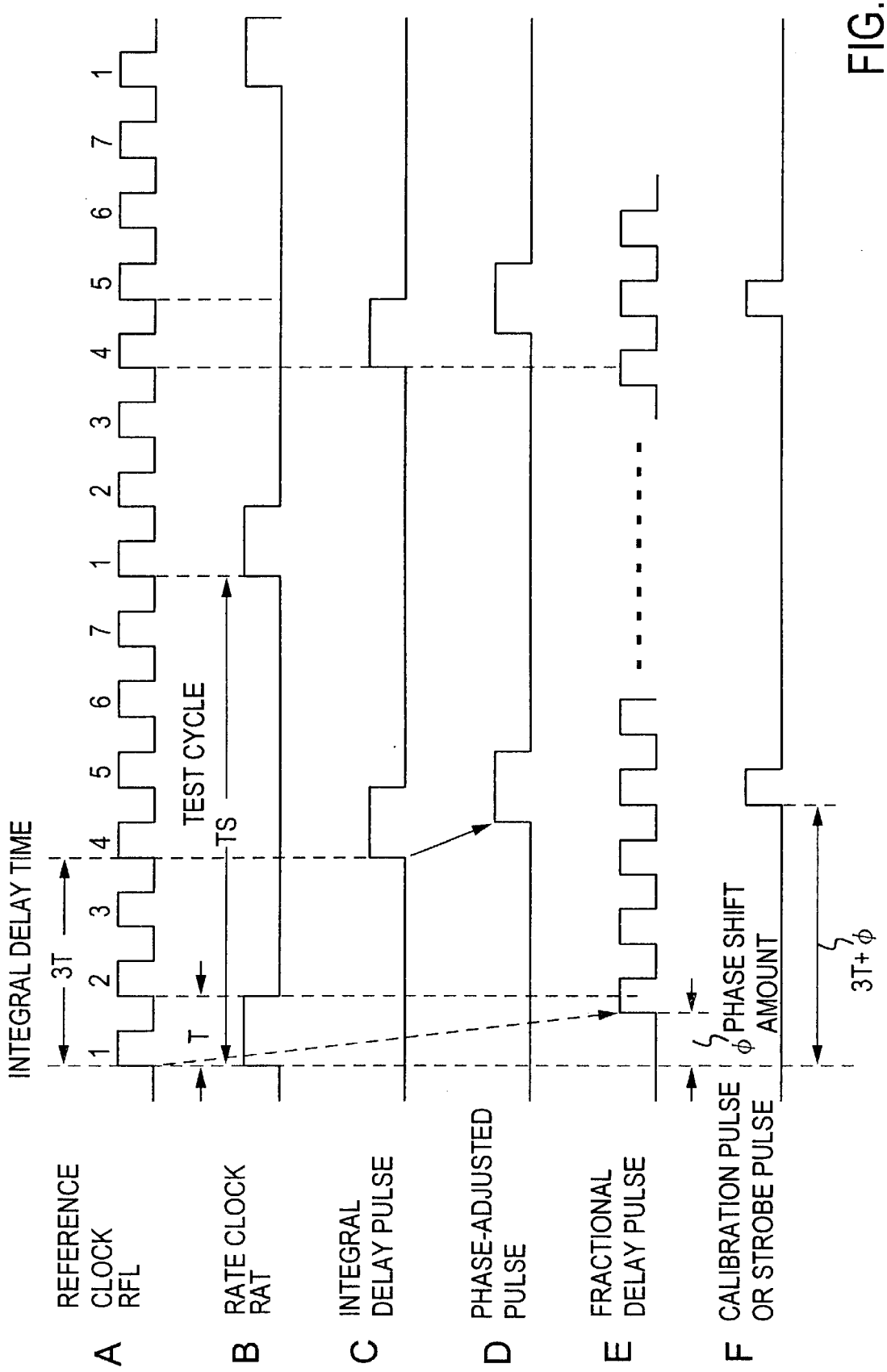
FIGS. 9A–9F are timing charts for explaining the operation of a variable delay circuit used in the calibration controller depicted in FIG. 8.

FIG. 9 shows how the above operations are carried out. FIG. 9A shows the reference clock RFL and FIG. 9B the rate clock RAT. The integral delay time generating part M generates an integral delay pulse (FIG. 9C) by delaying the rate clock RAT by a time interval corresponding to an integral multiple (3T in the illustrated example) of one period T of the reference clock RFL.

This integral delayed pulse and a fractional delay pulse (FIG. 9E) are input to the gate G1 or G2, wherein the fractional delay pulse is extracted by the integral delay pulse to thereby obtain a pulse (FIG. 9F) of a delay time $3T+\phi$ that a fractional delay amount $\phi$ is added to the integral delay time 3T. This pulse is provided as the calibration pulse CALP or strobe pulse STB to the reference driver DR-RF or reference comparator CP-RF mounted in the probe 300.

Incidentally, the FIG. 9 example shows the case where the integral delay pulse depicted in FIG. 9C is synchronized with the fractional delay pulse and to adjust their phases (FIG. 9D) to gate the fractional delay pulse at the central portion of the integral delay pulse in the gates G1 and G2.

Figure 10:
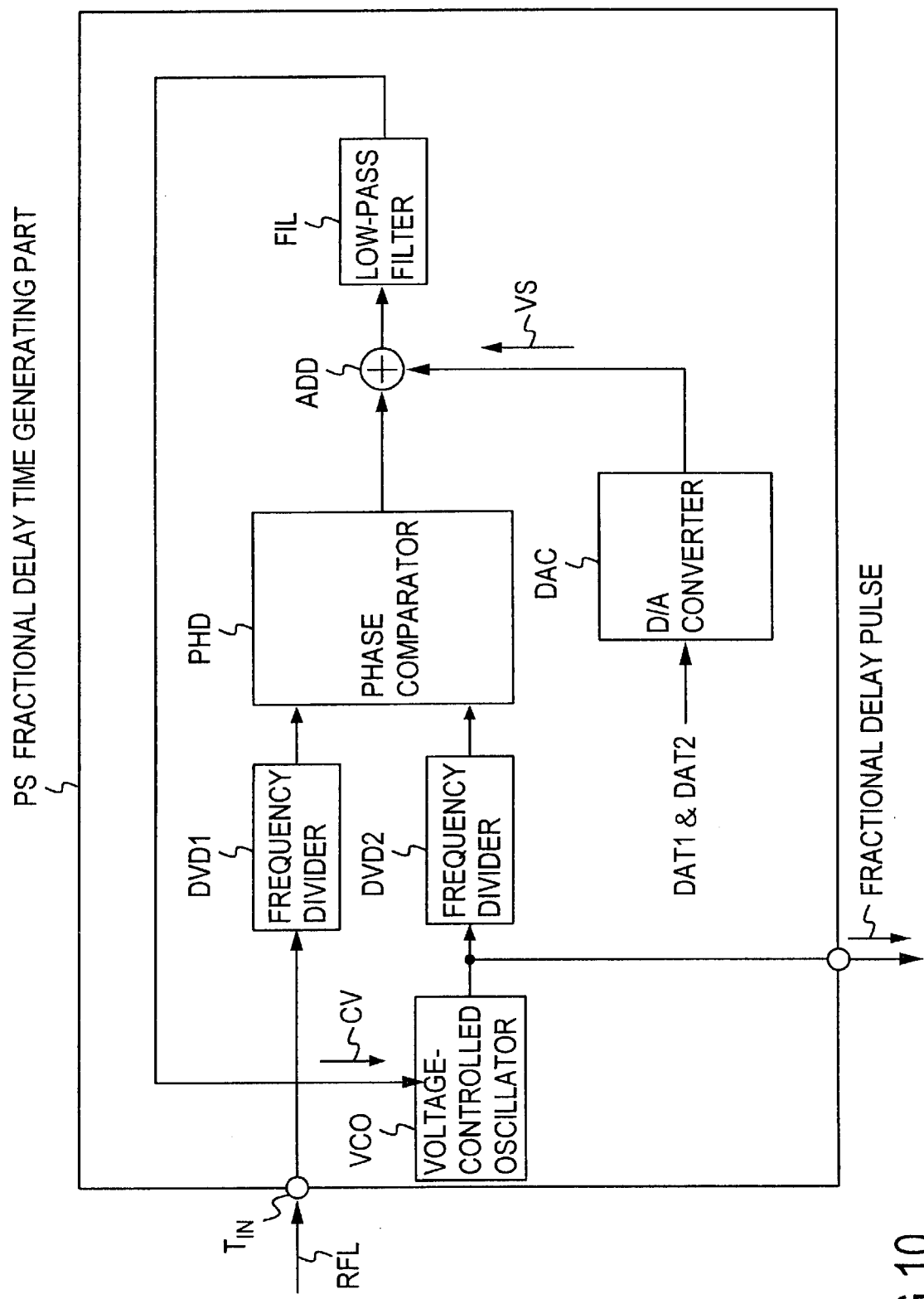
FIG. 10 is a block diagram for explaining an example of a fractional delay time generating part forming the variable delay circuit depicted in FIG. 8.
Figure 11:
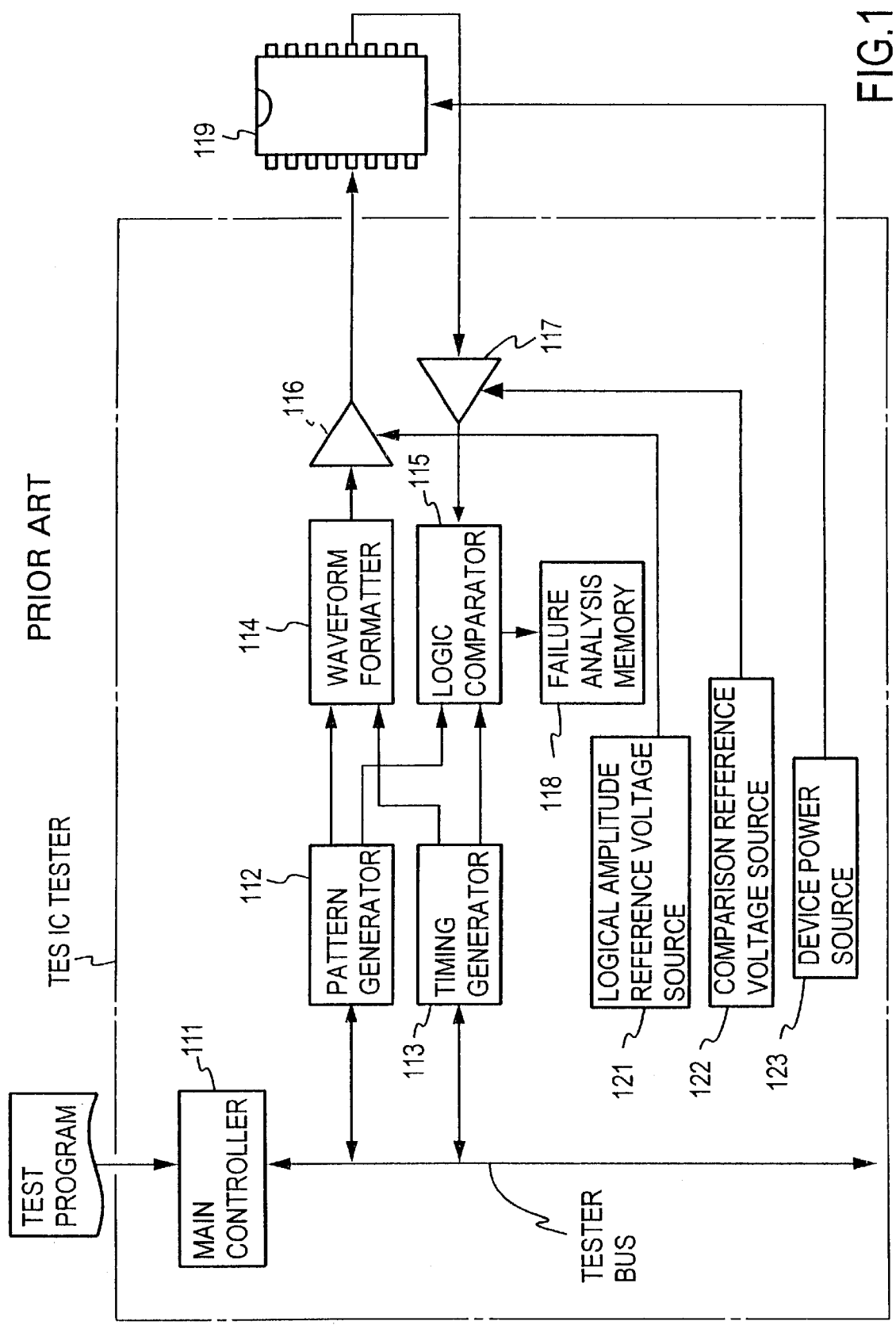
FIG. 11 is a block diagram for explaining the general configuration of an IC tester.
Figure 14:
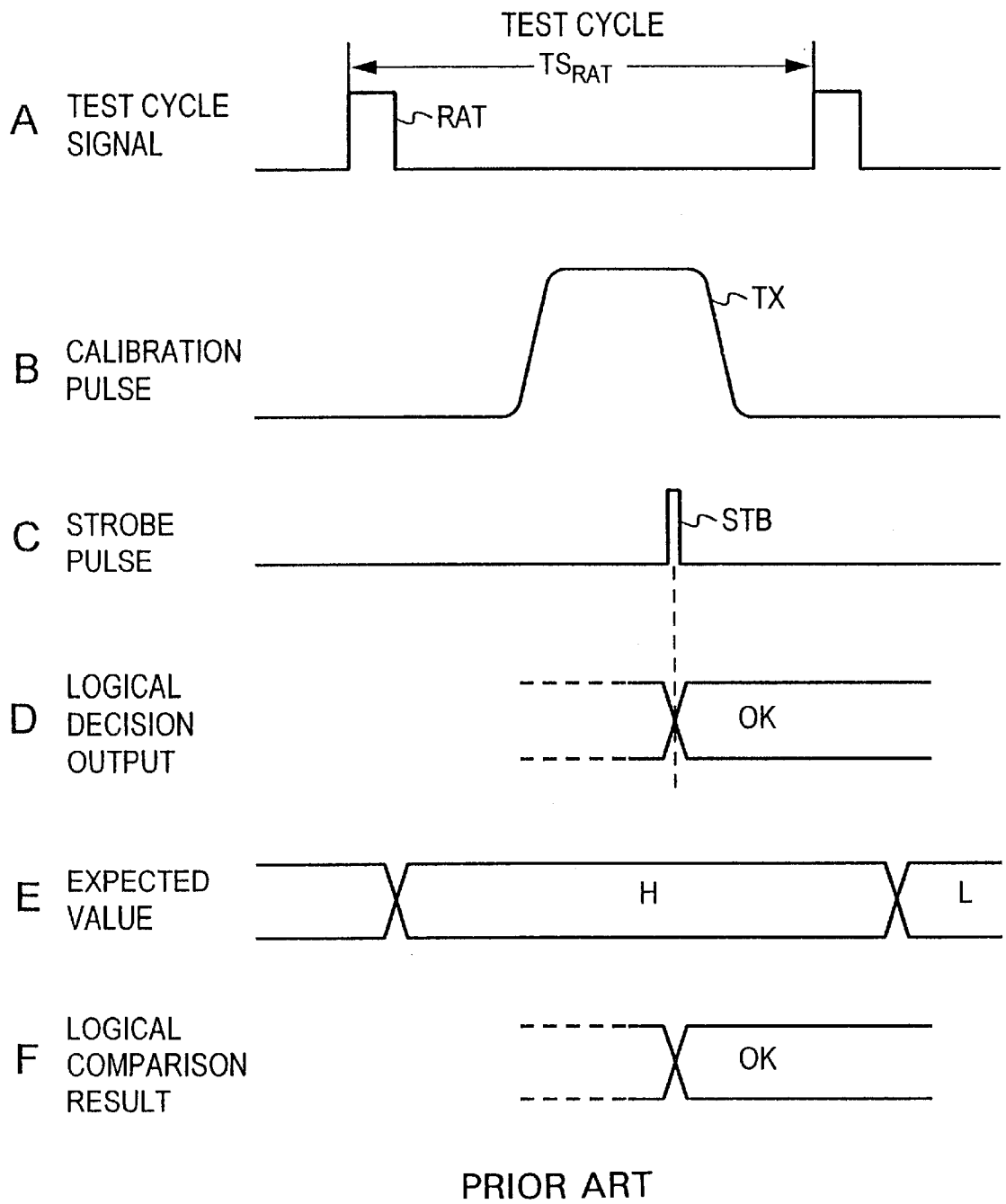
FIGS. 14A–14F are waveform diagrams for explaining one of functions of a comparator used in the IC tester depicted in FIG. 11.
Figure 15:
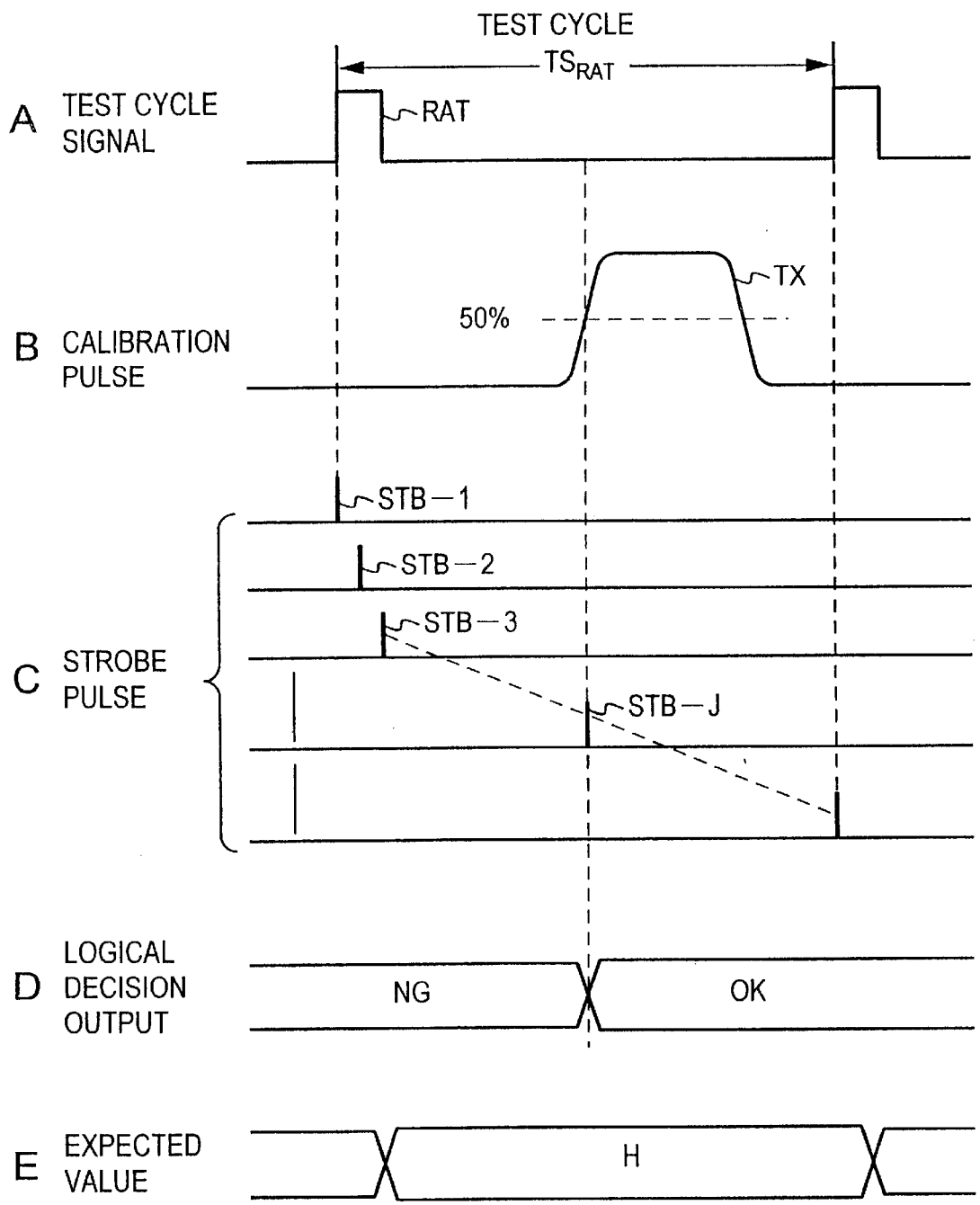
FIGS. 15A–15E are waveform diagrams for explaining another function of the comparator.

FIG. 10 depicts an embodiment of the fractional delay time generating part PS. This embodiment is shown to comprise a voltage-controlled oscillator VCO, a pair of frequency dividers DVD1 and DVD2, a phase comparator PHD, an analog adder ADD, a low-pass filter FIL, and a D/A converter DAC that provides a phase shift voltage VS to the analog adder ADD.

This circuit constitutes a well-known phase-locked loop (PLL). The reference clock RFL is applied to an input terminal Tin, and if necessary, it is frequency-divided and the frequency-divided output is fed to the one input terminal of the phase comparator PHD.

To the other input terminal of the phase comparator PHD is fed an oscillation signal of the voltage-controlled oscillator VCO and after being frequency-divided by the frequency divider DVD2. The frequency dividers DVD1 and DVD2 have the same frequency dividing ratio. Accordingly, the frequencies of the input signals to the phase comparator PHD is set at the same value, and the phase between the signals of the same frequency is compared by the phase comparator PHD, and the phase compared output is provided to the one input terminal of the analog adder ADD.

To the other input terminal of the analog adder ADD is provided a control voltage VS from the D/A converter DAC for setting the fractional delay time. The low-pass filter FIL is connected to the output side of the analog adder ADD, and a voltage signal CV smoothed by the low-pass filter FIL is taken out, the voltage signal CV being applied to a voltage-controlled terminal of the voltage-controlled oscillator VCO to control its oscillation phase.

This phase-locked loop PLL forms a closed feedback loop so that the output from the analog adder ADD becomes zero. Accordingly, this phase locked loop operates so that the output from the phase comparator PHD and the output from the D/A converter DAC are opposite in polarity but have the same value.

That is, when the output from the D/A converter is 0 V, the voltage-controlled oscillator VCO outputs a pulse train of the same phase as the reference clock RFL and the output from the phase comparator PHD also becomes 0 V. For example, when the output from the D/A converter DAC is 1 mV, the phase comparator PHD outputs −1 mV and the voltage-controlled oscillator VCO is shifted to a phase (lagging phase) in which to generate a phase compared output of −1 mV from the reference clock RFL.

Accordingly, by inputting from the D/A converter DAC a voltage signal that changes by steps of +1 mV, the pulse train that the voltage-controlled oscillator VCO is phase-shifted each time by an amount corresponding to −1 mV resolution. Assume that the transfer coefficient of the phase comparator PHD is, for example, 1 PS/1 mV; by inputting from the D/A converter DAC a signal that increases by steps of +1 mV, the phase of the pulse train that the voltage-controlled oscillator VCO oscillates is shifted by steps of 1 PS in the direction of delay.

Assuming that the D/A converter DAC is, for example, a 12-bit D/A converter and that the output resolution of the least significant bit is 1 mV, it outputs a voltage in the range of 1 mV to 4096 mV. Accordingly, the phase of the pulse train that the voltage-controlled oscillator VCO oscillates can be delayed from the same phase as the reference clock RFL to a phase lagging 4096 PS behind the reference clock.

With the use of the phase locked loop, the phase of the pulse train that the voltage-controlled oscillator VCO generates can be delayed over a wide range, and a pulse in the pulse train specified by the integral delay time is extracted as the calibration pulse CALP or strobe pulse STB; hence it is used as the calibration pulse CAL or strobe pulse STB while retaining high resolution. Accordingly, it is possible to obtain the calibration pulse CALP or strobe pulse of high timing accuracy.

Effect of the Invention

As described above, the present invention utilizes the function of setting the signal generating timing at prescribed timing and the function of measuring the input signal, which the IC tester 100 inherently possesses; hence, the invention permits low-cost fabrication of the calibration device. In addition, since the driver- and comparator-associated paths are both calibrated using direct waves, the calibration accuracy is high. Thus, the present invention offers a low-cost and highly accurate IC tester.

What is claimed is:

1. An integrated circuit (IC) tester testing an IC under test which has a calibration function, wherein the IC tester comprises:

a timing/pattern generator;

drivers each provided in correspondence with a respective pin of an IC socket on which the IC under test is mounted;

comparators each provided in correspondence with a respective pin of the IC socket;

driver variable delay circuits each provided in series with and in correspondence with a respective driver;

strobe variable delay circuits each provided in a signal path of a strobe pulse for a respective comparator;

a probe including a reference driver and a reference comparator; and calibration control means including a reference driver variable delay circuit and a reference strobe variable delay circuit;

wherein to perform the calibration function, (a) the timing/pattern generator is operable to supply
a reference strobe pulse having a reference timing to the reference comparator of the probe,
a reference calibration pulse having the reference timing of the reference strobe pulse to the reference driver of the probe,
strobe pulses having the same timing to each other to said comparators, respectively, and
calibration pulses having the same phase to each other to said drivers, respectively, (b) the probe is operable to contact selectively respective pins of the IC socket
so that, during calibration of the comparators, the comparator connected to a selected pin of the IC socket captures a logical value of the reference calibration pulse supplied to the selected pin of the IC socket from the reference driver at a timing of the strobe pulse supplied thereto from the timing/pattern generator through a respective strobe variable delay circuit, and
so that, during calibration of the drivers, the reference comparator captures the logical value of the calibration pulse applied to the selected pin of the IC socket through a respective driver variable delay circuit from a driver at the reference timing of the reference strobe pulse, and (c) the calibration control means is operable to control
said driver variable delay circuit so that the phase of said calibration pulse applied to the selected pin of said IC socket from said driver coincides with the reference timing of said reference strobe pulse, and
said strobe variable delay circuit so that the timing of said reference calibration pulse to be applied to the selected pin of said IC socket coincides with the timing of the strobe pulse to be applied to the comparator corresponding to said selected pin.

2. An integrated circuit (IC) tester which has drivers each connected to a respective pin of an IC socket on which an IC under test is placed, for applying a test pattern signal to an input terminal of the IC under test, and comparators each provided in correspondence with a respective pin of the IC socket for capturing a logical value of a response output signal obtained from an output terminal of the IC under test, and decides whether the response output signal coincides with a predetermined expected value to determine whether said IC under test is a defective article, wherein said IC tester has a calibration function and comprises:

a probe for selectively contacting respective pins of said IC socket;

a reference comparator mounted in said probe for capturing respective calibration pulses applied to respective pins of said IC socket while in contact with said probe at a reference timing of a reference strobe pulse;

a reference driver mounted in said probe for applying reference calibration pulses to respective pins of said IC socket while in contact with said probe;

driver variable delay circuits each provided in a signal path of a respective driver for adjusting a delay time of the calibration pulse to be applied through said respective driver to a corresponding pin of said IC socket;

strobe variable delay circuits each provided in a signal path of a strobe pulse to be applied to a respective comparator for adjusting a delay time of said strobe pulse; and calibration control means for calibrating the drivers by comparing a logical value of the calibration pulse captured by said reference comparator with an expected value, and controlling each driver variable delay circuit so that phases of calibration pulses applied to respective pins of said IC socket from each of said drivers coincide with the reference timing of said reference strobe pulse, and for calibrating the comparators by controlling each said strobe variable delay circuit so that the timings of strobe pulses to be applied to the respective comparators coincide with the timing of said reference calibration pulse to be applied to respective pins of said IC socket.

3. The IC tester as claimed in claim 2, which further comprises:

a reference calibration pulse variable delay circuit provided in the signal path of said reference driver for adjusting the timing of said reference calibration pulse; and a reference strobe pulse variable delay circuit provided in the signal path of said reference strobe pulse for adjusting the timing of said reference strobe pulse.

4. The IC tester as claimed in claim 3, wherein said probe is supported by an automatic positioning device movable in X, Y and Z directions above a test head with said IC socket placed thereon, and automatically contacts each pin of said IC socket to perform timing calibration of driver- and comparator-associated signal paths.

5. The IC tester as claimed in claim 4, wherein a plurality of such probes are provided, which are automatically contacted with a plurality of IC sockets, respectively, to simultaneously perform timing calibration of driver- and comparator-associated signal paths connected to said IC sockets.

6. The IC tester as claimed in claim 4, which has a construction in which an output terminal of the reference driver and an input terminal of the reference comparator mounted in said probe are connected to separately provided contacts and the output of the reference driver and the input of the reference comparator are contacted with each pin of said IC socket through said independent contacts to perform timing calibration.

7. The IC tester as claimed in claim 6, which has a construction in which a short pad is provided on the surface of movement of said contacts; the contact connected to the output terminal of said reference driver and the contact connected to the input terminal of said reference comparator are contacted with said short pad to short them; and the reference calibration pulse from said reference driver is fed via said short pad to said reference comparator to calibrate the timing of either one of said reference driver and said reference comparator.

8. The IC tester as claimed in any one of claims 2 to 7, wherein there is provided means for adjusting the delay time difference between rise and fall of detection pulses that are output by said reference comparator.

9. The IC tester as claimed in claim 7, wherein said reference calibration pulse variable delay circuit and said reference strobe pulse variable delay circuit each comprises:

a fractional delay time generating part formed by a phase locked loop and adding means for finely shifting oscillation phase of a voltage-controlled oscillator forming the phase locked loop; and an integral delay time generating part for generating a delay time that is an integral multiple of pulse period of a pulse train of a reference frequency that is applied to said phase locked loop.

10. The IC tester as claimed in any one of claims 3 to 7, wherein said probe has mounted therein a constant temperature chamber, in which said reference driver, said reference comparator, said reference calibration pulse variable delay circuit and said reference strobe pulse variable delay circuit are mounted to keep temperature constant.

11. A timing calibration method for an integrated circuit (IC) tester that comprises an IC socket having a plurality of pins to be calibrated, a plurality of comparators each connected to a respective one of the pins, and a probe including a reference driver, said method comprising the steps of:

(a) applying a reference calibration pulse from said reference driver of said probe to a first selected pin of said IC socket while in contact with the probe;

(b) capturing said reference calibration pulse applied from said reference driver to said first selected pin by one comparator of said plurality of comparators that is connected to said first selected pin at the timing of a strobe pulse that is provided to said one comparator;

(c) calculating a deviation between the timing of said reference calibration pulse and the timing of said strobe pulse for said one comparator;

(d) adjusting the delay time of a timing calibrating variable delay circuit provided in a signal path of said strobe pulse for said one comparator so that said deviation for said one comparator becomes a predetermined value for comparator; and (e) repeating steps (a) to (d) for a different first selected pin until the deviations for respective comparators become the same predetermined value for comparator to thereby calibrate said plurality of comparators.

12. The timing calibration method as claimed in claim 11, which further comprises a step of pre-adjusting the delay time of a timing calibrating variable delay circuit for the reference driver provided in the signal path of said reference calibration pulse so that the timing of the reference calibration pulse from said reference driver coincides with the timing of a strobe pulse that is provided to a comparator connected to a predetermined reference pin of said IC socket.

13. The timing calibration method according to claim 11, wherein the integrated circuit (IC) tester further comprises a plurality of drivers each connected to a respective one of said pins and said probe further includes a reference driver, said method further comprising the steps of:

(f) applying a calibration pulse from one driver of the plurality of drivers to a second selected pin of said IC socket that is connected to said one driver while in contact with the probe;

(g) capturing said calibration pulse from said one driver through said second selected pin by said reference comparator of said probe at the timing of a reference strobe pulse that is provided to said reference comparator;

(h) calculating a deviation between the timing of said calibration pulse from said one driver and the timing of said reference strobe pulse;

(i) adjusting the delay time of a timing calibrating variable delay circuit provided in a signal path of said one driver so that said deviation for said one driver becomes a predetermined value for driver;

(j) repeating steps (f) to (i) for a different second selected pin until the deviations for respective drivers become the same predetermined value for driver to thereby calibrate said plurality of drivers.

14. The timing calibration method as claimed in claim 13, wherein said first selected pin and said second selected pin are the same pin.

15. The timing calibration method as claimed in claim 13, which further comprises pre-adjusting the delay time of a timing calibrating variable delay circuit for the reference comparator provided in the signal path of said reference strobe pulse so that the timing of said reference strobe pulse coincides with the timing of a calibration pulse provided from a predetermined reference pin of said IC socket.

16. The timing calibration method as claimed in claim 13, which further comprises pre-adjusting the delay time of a timing calibrating variable delay circuit for the reference driver provided in the signal path of said reference calibration pulse so that the timing of the reference calibration pulse from said reference driver coincides with the timing of a strobe pulse that is provided to a comparator connected to a predetermined reference pin of said IC socket.

17. The timing calibration method as claimed in claim 13, which further comprises adjusting either the delay time of a timing calibrating variable delay circuit provided in the signal path of said reference calibration pulse or the delay time of a timing calibrating variable delay circuit provided in the signal path of said reference strobe pulse so that the timing of the reference calibration pulse from said reference driver coincides with the timing of the reference strobe pulse that is provided to said reference comparator.

18. An integrated circuit (IC) tester having an IC testing function for testing an IC under test and a calibration function, comprising:

comparators each provided in correspondence with a respective pin of an IC socket on which the IC under test is placed for capturing a logical value of a response output signal obtained from an output terminal of the IC under test at a timing of a strobe pulse during the IC testing function;

a probe for selectively contacting the pins of said IC socket one after another;

a reference driver mounted in said probe for applying a reference calibration pulse to a selected pin of said IC socket;

strobe variable delay circuits, wherein each strobe variable delay circuit is provided in a path of the strobe pulse to be applied to each of said comparators, for adjusting a delay time of said strobe pulse; and calibration control means for controlling each of said strobe variable delay circuits so that the timing of the strobe pulses to be applied to respective comparators coincide with the timing of said reference calibration pulse to be applied to respective pins of said IC socket.

\* \* \* \* \*